(12) United States Patent
Koburger, III et al.

(10) Patent No.: US 8,946,866 B2
(45) Date of Patent: Feb. 3, 2015

(54) MICROELECTRONIC SUBSTRATE HAVING REMOVABLE EDGE EXTENSION ELEMENT

(75) Inventors: Charles W. Koburger, III, Delmar, NY (US); Steven J. Holmes, Guilderland, NY (US); David V. Horak, Essex Junction, VT (US); Kurt R. Kimmel, Waterford, NY (US); Karen E. Petrillo, Voorheesville, NY (US); Christopher F. Robinson, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 13/490,239

(22) Filed: Jun. 6, 2012

(65) Prior Publication Data

US 2012/0241913 A1   Sep. 27, 2012

Related U.S. Application Data

(62) Division of application No. 11/162,765, filed on Sep. 22, 2005, now Pat. No. 8,202,460.

(51) Int. Cl.
    *H01L 29/06* (2006.01)
    *G03F 7/20* (2006.01)
(52) U.S. Cl.
    CPC ........ *G03F 7/70691* (2013.01); *G03F 7/70341* (2013.01); *G03F 7/70808* (2013.01)
    USPC ..................... 257/618; 264/272.17
(58) Field of Classification Search
    CPC ............ H01L 2224/97; H01L 2224/82; H01L 2224/96; H01L 2924/00014; H01L 21/566
    USPC ...................... 257/618; 264/272.17
    See application file for complete search history.

(56) References Cited

U.S. PATENT DOCUMENTS

2005/0064681 A1 *   3/2005   Wood et al. .................... 438/459

FOREIGN PATENT DOCUMENTS

JP    2001093867    *   4/2001

OTHER PUBLICATIONS

Machine translation of JP2001093867 (Apr. 2001).*

* cited by examiner

*Primary Examiner* — Matthew W Such
*Assistant Examiner* — Ali Naraghi
(74) *Attorney, Agent, or Firm* — Yuanmin Cai; Ira D. Blecker (57) ABSTRACT

An article including a microelectronic substrate is provided as an article usable during the processing of the microelectronic substrate. Such article includes a microelectronic substrate having a front surface, a rear surface opposite the front surface and a peripheral edge at boundaries of the front and rear surfaces. The front surface is a major surface of the article. A removable annular edge extension element having a front surface, a rear surface and an inner edge extending between the front and rear surfaces has the inner edge joined to the peripheral edge of the microelectronic substrate. In such way, a continuous surface is formed which includes the front surface of the edge extension element extending laterally from the peripheral edge of the microelectronic substrate and the front surface of the microelectronic substrate, the continuous surface being substantially co-planar and flat where the peripheral edge is joined to the inner edge.

20 Claims, 4 Drawing Sheets

MICROELECTRONIC SUBSTRATE HAVING REMOVABLE EDGE EXTENSION ELEMENT

The present application is a divisional of U.S. patent application Ser. No. 11/162,765, filed Sep. 22, 2005, entitled "MICROELECTRONIC SUBSTRATE HAVING REMOVABLE EDGE EXTENSION ELEMENT", now U.S. Pat. No. 8,202,460, the disclosure of which is incorporated by reference herein.

BACKGROUND OF THE INVENTION

The invention relates processing of microelectronic substrates and more particularly to an edge extension element aid in such processing.

One of the conditions necessary for the growth of the semiconductor industry is the ability to print ever smaller features on an integrated circuit (IC). However, recently, optical photolithography is facing several challenges which may impede the further development of semiconductor technology. Investments have been made in techniques such as x-ray lithography and electron beam lithography as an alternative to traditional optical lithography. However, optical immersion lithography has garnered interest as potentially meeting the demands of improved semiconductor technology for printing smaller-sized features.

The minimum size W of a feature that may be printed with an optical lithography system is determined by the following equation:

$$W = k_1 \lambda / NA \qquad \text{Eq. 1}$$

where $k_1$ is the resolution factor, $\lambda$ the wavelength of the exposing radiation and NA is the numerical aperture of the interfacial medium through which the exposing radiation is transmitted at the interface to the feature that is being printed.

As the minimum feature size W has been reduced in the development of semiconductor devices, the wavelength of the exposing radiation has also been reduced. However, the development of new optical exposure sources having further reduced wavelengths faces many challenges, as do improvements in the design of optics required to transmit and focus the light from such reduced wavelength sources.

Looking at Eq. 1 again, it can be seen that the minimum size W is also a function of the numerical aperture NA and becomes smaller when the numerical aperture becomes larger. The numerical aperture is quantified by n sin $\alpha$, where n is the index of refraction of the interfacial medium between the lens and the feature being printed, and $\alpha$ is the acceptance angle of the lens. The sine of any angle is always less than or equal to one and n is approximately equal to one when air is the interfacial medium, so that the numerical aperture cannot exceed one as long as air is the interfacial medium. Replacing air with another medium can increase the effective numerical aperture of the system. In addition to the interfacial medium needing an index of refraction greater than one, such medium should also meet a number of other requirements. For example, the interfacial medium should have a low rate of optical absorption, be compatible and non-contaminating with respect to photoresist and lens materials, and provide a uniform medium. Such requirements appear to be fulfilled by water when the wavelength of the optical exposure source is 193 nm, but a number of practical problems still need to be addressed for optical immersion lithography.

For one, the exposure tool must be able to step quickly from location to location across a wafer to achieve an acceptable rate of throughput. However, rapid motion through a liquid may cause perturbations in the liquid and formation of bubbles. Different approaches have been taken to resolve such problems. However, each such approach has shortcomings. In a first approach, the wafer and the lens are immersed in a pool of water. However, as noted, rapid movement through the water can lead to perturbations and the formation of bubbles which interfere with the quality of the exposure. In another approach, water is dispensed by a nozzle only to the interface between the wafer and the lens and is maintained at such interface by surface tension. Such tools include a device referred to as a "shower head" for dispensing water ahead of the moving lens to a limited area of the wafer and include a vacuum-based or other removal element for removing the wafer from the wafer surface after the lens has passed by.

However, this approach has its own challenges. One such challenge involves the ability to print features disposed at an edge of the wafer. To maximize productivity, the edge of the wafer needs to be fully populated with chips. Immersion lithography tools used in this approach (or possibly others) can have difficulty making lithographic exposures at the edge of the wafer. The immersion liquid may run off the edge of the wafer, or a wafer chuck used to mount the wafer and stop the flow of liquid may interfere with the proper processing of the wafer at the edge of the wafer.

For example, one such technique utilizes a chuck having a raised ring which prevents water from escaping from the chuck.

Similar edge-related problems also exist in chemical-mechanical polishing (CMP), where erosive processes have different rates at the wafer edge than at the center, depending on the geometry of a carrier which holds the wafer, the thickness of the wafer, the age of a film present on the "back" or rear (typically unpatterned) surface of the wafer, differences in intake of moisture intake between the edge and the center of the wafer, among others.

Consequently, a method and structure are desired to address problems of lithographically printing features by optical immersion lithography near an edge of a wafer.

SUMMARY OF THE INVENTION

According to one aspect of the invention, an article is provided which includes a microelectronic substrate as an article usable during the processing of the microelectronic substrate. Such article includes a microelectronic substrate having a front surface, a rear surface opposite the front surface and a peripheral edge at boundaries of the front and rear surfaces. The front surface is a major surface of the article. A removable annular edge extension element having a front surface, a rear surface and an inner edge extending between the front and rear surfaces has the inner edge joined to the peripheral edge of the microelectronic substrate. In such way, a continuous surface is formed which includes the front surface of the edge extension element extending laterally from the peripheral edge of the microelectronic substrate and the front surface of the microelectronic substrate, the continuous surface being substantially co-planar and flat where the peripheral edge is joined to the inner edge. The continuous surface extends beyond the peripheral edge.

According to one or more preferred aspects of the invention, the article includes a releasable layer which joins the peripheral edge of the microelectronic substrate to the inner edge of the edge extension element. Such releasable layer is preferably at least substantially insoluble in water and is at least substantially soluble in a solvent other than water.

According to a preferred aspect of the invention, the microelectronic substrate includes a semiconductor wafer. Preferably, the edge extension element includes a polymer. The polymer is preferably a thermo-set polymer. The polymer may be one which is settable by light. According to a particular preferred aspect of the invention, the edge extension element consists essentially of at least one material selected from the group consisting of polyimide, polymethyl methacrylate, polycarbonate, and a combination of polyvinyl alcohol with melamine.

According to a preferred aspect of the invention, the edge extension element has a width ranging between about 0.25 cm and 2.5 cm. Preferably, the edge extension element has a thickness between the front surface of the edge extension element and the rear surface of the edge extension element which is greater than a thickness of the microelectronic substrate between the front surface and the rear surface of the microelectronic substrate.

According to one or more preferred aspects of the invention, the edge extension element has a thickness between the front surface of the edge extension element and the rear surface of the edge extension element, the thickness of the edge extension element being substantially the same as a thickness between the front surface of the microelectronic substrate and the rear surface of the microelectronic substrate.

According to one or more preferred aspects of the invention, the edge extension element includes a dam extending upward from the front surface of the edge extension element, the dam including the polymer.

According to one or more preferred aspects of the invention, the edge extension element includes a flexible sheet extending upwardly to a height above the front surface of the edge extension element, the flexible sheet being adapted to prevent a liquid from flowing off of the continuous surface of the article.

According to one or more preferred aspects of the invention, the edge extension element directly contacts the peripheral edge of the microelectronic substrate and the edge extension element consists essentially of one or more materials that at least substantially insoluble in water and at least substantially soluble in a solvent other than water.

In accordance with a particular preferred aspect of the invention, substantially all of the rear surface of the microelectronic substrate is exposed.

According to one aspect of the invention, an article is provided which includes a semiconductor wafer having a front surface, a rear surface opposite the front surface and a peripheral edge at boundaries of the front and rear surfaces. The front surface is a major surface of the article. The article also includes a removable annular edge extension element which consists essentially of at least one material selected from the group consisting of a polymer that is settable by heat and a polymer this is settable by light. The edge extension element has a front surface, a rear surface and an inner edge extending between the front and rear surfaces. The inner edge is joined to the peripheral edge of the semiconductor wafer to form a continuous surface that includes the front surface of the edge extension element extending laterally from the peripheral edge of the microelectronic substrate and the front surface of the semiconductor wafer such that the continuous surface is substantially co-planar and flat between the peripheral edge and the inner edge, and the front surface of the edge extension element extends laterally between about 0.25 cm and about 2.5 cm beyond the peripheral edge of the semiconductor wafer

DETAILED DESCRIPTION OF THE PREFERRED EMBODIMENTS

Figure 1A:
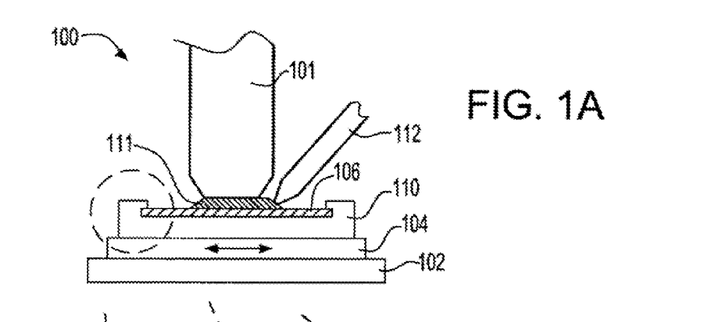
FIG. 1 is a diagram illustrating components of an exemplary immersion photolithography exposure system for processing a microelectronic substrate in accordance with one embodiment of the invention.

FIG. 1A is a sectional view illustrating an exemplary immersion optical lithography system with which a method of processing a microelectronic substrate, e.g., a semiconductor wafer is performed in accordance with one embodiment of the invention. As shown in FIG. 1A, the immersion lithography system includes an optical projection system 101 including a source and a lens. The semiconductor wafer is mounted for movement relative to the optical projection system. For example, specifically, a movable stage 104 is mounted to a fixed base 102, the stage 104 typically being movable in two or more directions relative to the base and to the optical projection system 101. A semiconductor wafer 106 having a removable edge extension element, e.g., element 108 (FIG. 1B), attached to the wafer is mounted to a wafer chuck 110 for movement with the stage 104 relative to the optical projection system. The wafer having the edge extension element attached thereto is referred to herein as an "extended wafer" 106. The edge extension element is attached to the peripheral edge of the semiconductor wafer preferably through a process by which a polymer is molded onto a surface to form a continuous substantially co-planar and flat surface including the front surface of the semiconductor wafer. An immersion liquid 111, e.g., purified water, is supplied to fill the interfacial region between the projection system 101 and the extended wafer 106 such that light from the lens of the projection system passes through the liquid and is focused there through onto a portion of the extended wafer 106. The liquid is typically dispensed just to the side of the projection system such that the movement of the wafer relative thereto causes the interfacial region between the projection system and the wafer to remain filled with the liquid. Typically, the immersion lithography system 100 also includes a mechanism (not shown), e.g., one which uses vacuum or other force, for removing the liquid at an edge of the projection system 101 opposite the edge of projection system to which the liquid is dispensed. During lithographic processing of the semiconductor wafer, the edge extension element remains attached to the peripheral edge of the semiconductor wafer. In this way, the semiconductor wafer is processed uniformly even in areas adjacent to the peripheral edge where the various problems described above in the background could occur. When there is no longer a need for the edge extension element, e.g., after immersion lithographic processing has been completed, the edge extension element is removed from the peripheral edge of the semiconductor wafer. Other processing can then be performed, e.g., to sever the wafer into individual chips.

Figures 1B, 1C:
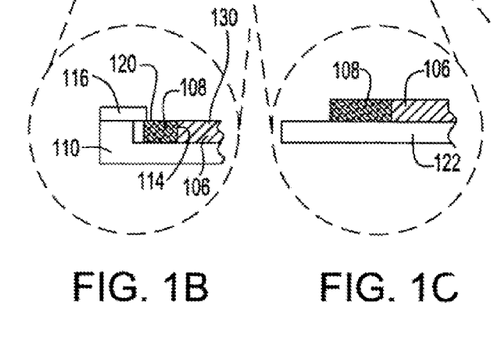
Figure 1D:
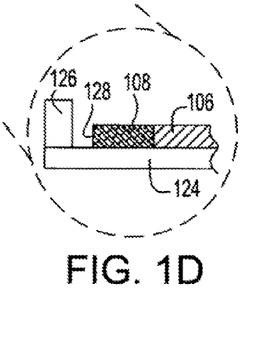

FIGS. 1B, 1C and 1D are expanded views illustrating portions of the wafer and wafer chuck elements of the immersion lithography system 100. As shown in FIG. 1B, an extended wafer 106 including an edge extension element 108 is mounted to the wafer chuck. The front surface 130 of the semiconductor wafer 106 and the front surface 120 of the edge extension element 108 form a continuous surface which is substantially flat and co-planar between a peripheral edge 114 of the wafer and an inner edge (also at 114) of the edge extension element. A clamp 116 extends onto a front surface 120 of the edge extension element 108, holding the wafer 106 in fixed relation to the chuck 110.

In an alternative arrangement shown in FIG. 1C, the extended wafer 106 is held to a different kind of chuck 122 by means of a vacuum or electro-static force, thus eliminating the need for a clamp to contact the front surface of the wafer or edge extension element. FIG. 1D illustrates yet another arrangement in which the extended wafer 106 is held to a chuck 124 by means of a vacuum or electro-static force but in which the chuck includes a rim 126 to contain the liquid, in case the liquid spills from an outer edge 128 of the edge extension element onto the chuck 124.

Thus, the extended wafer can be used in immersion lithography systems having a variety of mechanisms for supplying a liquid to and dealing with the liquid present at the front surface of the extended wafer. In another example, the extended wafer 106 is mounted to a chuck according to any one of the FIGS. 1B through 1D and relative movement is applied between the extended wafer and a polishing surface to polish the front surface of the wafer during a process of mechanical or chemical mechanical polishing.

By polishing the extended wafer having the edge extension element attached thereto instead of holding a bare wafer in contact with the polishing surface, improved results of polishing can be obtained at the peripheral edge of the semiconductor wafer.

Figure 2:
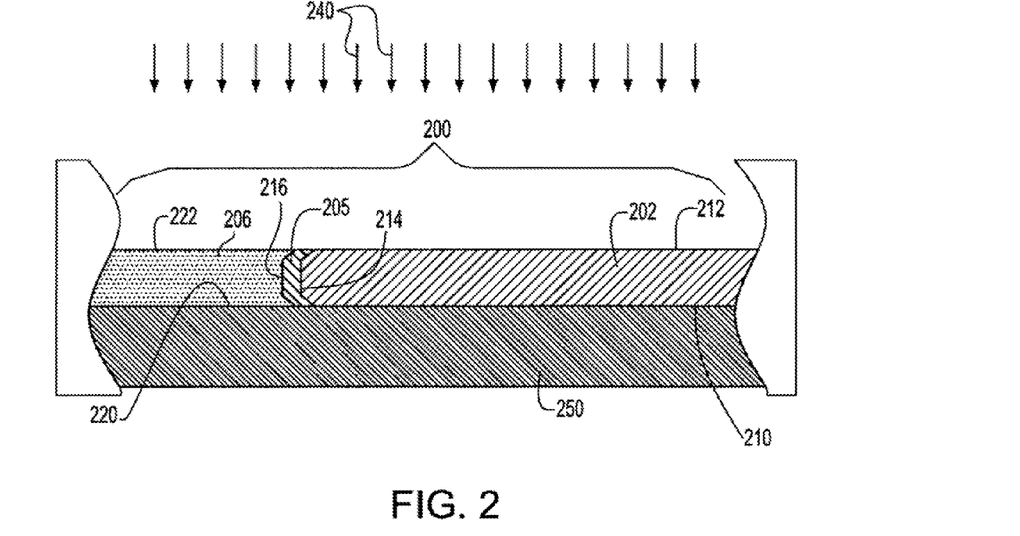
FIG. 2 is a sectional diagram illustrating a microelectronic substrate including an edge extension element and a method of forming an edge extension element onto an edge of the microelectronic substrate according to a particular embodiment of the invention.

FIG. 2 is a sectional view of an extended wafer 200 illustrated in a face-down position, the extended wafer including a microelectronic substrate 202 such as a semiconductor wafer having a front surface 210 resting against a front element 250 of a mold used in its fabrication. During subsequent processing to form devices in the microelectronic substrate, the front surface 210 is photolithographically processed, as described above with reference to FIGS. 1A-1D. As shown in FIG. 2, the front surface 210 is bounded by a peripheral edge 214. Typically, the front surface 210 is a major surface of the semiconductor wafer and is flat and at least substantially planar. At the peripheral edge 214, the semiconductor wafer 202 is attached to an inner edge 216 of an edge extension element 206 by a releasable layer 205. The edge extension element is preferably formed by a molding process which molds the edge extension element onto the peripheral edge of the wafer to form an integral extended wafer having a continuous and substantially flat and co-planar front surface.

The releasable layer is preferably formed of a material which is at least substantially insoluble in the immersion liquid but which is at least substantially soluble in a solvent other than the immersion liquid. In such way, the releasable layer maintains the edge extension layer in attachment to the semiconductor wafer during designated processing and then permits the two to become detached again when the designated processing is complete. In one example, the releasable layer includes a material such as a photoresist which is substantially insoluble in water (the immersion liquid) but which can be efficiently removed by a developer solution or known wafer post-etch cleaning procedures. A photoresist polymer which remains unprotected during and after application can be removable during subsequent processing. Preferably, such photoresist material is applied to the peripheral edge 214 of the semiconductor wafer through a "spin-on" process and then at least partially hardened through controlled heating referred to as a "post-apply-bake" process. The lower the temperature that the photoresist material is heated during this process, the more soluble and more easily removed it will be when it is removed during the subsequent removal step.

In one example, the releasable layer can include a material commonly known as a "lift-off layer". An example of a lift-off-layer is a product sold under the name "LOL-2000" by Shipley, a commercial photoresist manufacturer. The LOL-2000 product is an "inert" polymer not sensitive to ultraviolet ("UV") light, as opposed to chemically active UV sensitive polymers included in photoresist materials. One characteristic of such lift-off-layer is that photoresist materials and other polymers stick fast to the lift-off-layer. Another characteristic is that typically the LOL-2000 layer can be removed by contact with solvents used to develop exposed photoresist patterns that overlie the LOL-2000 layer after photolithographic exposure and with other solvents as well. In such manner, after immersion photolithography processes are completed, the edge extension element can be removed together with the releasable layer by contacting the releasable layer with the appropriate solvent. This is preferably performed by a post-lithographic cleaning process of removing unexposed photoresist patterns and detaching the releasable layer using an appropriate solvent.

Since the LOL-2000 product is soluble in developers used with photoresists, a releasable layer including a lift-off-layer product such as LOL-2000 is protected from delamination during photolithographic processing in the following way. A photoresist layer that covers the extended wafer covers the releasable layer at the edge of the semiconductor portion of the extended wafer. Since the actual edge of the semiconductor wafer is not exposed to UV light during the photolithographic exposure of the wafer, the releasable layer is protected during the development of the photoresist patterns after exposing the semiconductor wafer to the photolithographic imaging light. When the releasable layer is a lift-off layer such as LOL-2000, a post-apply-bake step is preferably performed at a temperature of 200 degrees Celsius or lower to harden the lift-off-layer after its initial application to the semiconductor wafer.

In another example, the releasable layer includes a "top coat" such as that typically used to cover a photoresist layer on the front surface 210 of the semiconductor wafer 202 during immersion lithographic patterning of the photoresist layer. Such top coat is soluble in a solution containing tetramethyl ammonium hydroxide (TMAH). An example of such top coat is a product identified as TCX007 manufactured by JSR (Japanese Synthetic Rubber Co., Ltd.). Such top coat is desirably applied simultaneously to a photoresist layer on the front surface of the wafer and to the peripheral edge 214 such that it functions both as a traditional top coat and functions as the releasable layer in a manner such as described above.

After applying and hardening the releasable layer through a post-apply-bake process, a removable annular edge extension element is formed in attachment with the releasable layer. The edge extension element is preferably formed by a process of depositing and molding a polymer into a continuous surface which is substantially co-planar and flat where the peripheral edge of the semiconductor wafer meets an inner edge 216 of the edge extension element. The strength of the material from which the edge extension element is made (polymer) should be sufficient that the edge extension element is not damaged by handling during subsequent lithographic processes. The edge extension element preferably has a width ranging between about 0.25 cm and about 5 cm, and most preferably has a width of about 1.5 cm. Preferably, the edge extension element has the same thickness between front surface 220 and rear surface 222 thereof as between the front surface 210 and the rear surface 212 of the semiconductor wafer. That thickness is typically about 775 nanometers (nm) for a wafer having a nominal diameter of 300 millimeters (mm). The rear surface 222 of the edge extension element is preferably continuous, co-planar and flat relative to the rear surface 212 of the semiconductor wafer 202. However, in a particular embodiment, the rear surface 222 need not have such properties in order to support processing of the front surface of the wafer, as will be described below with reference to FIG. 4.

Various types of polymers are preferred for use in forming the edge extension element. Thermo-set polymers and those which are settable by light are preferred. Polymers which are settable by ultraviolet light are more preferred. Semiconductor wafers, especially those made of silicon are substantially opaque to ultraviolet wavelengths, permitting some beneficial results to be obtained as will be described below. Polyimide, polymethyl methacrylate, a combination of polyvinyl alcohol and melamine, and polycarbonate are considered suitable and preferred for use in forming the edge extension element.

Referring to FIG. 2, a method is illustrated for forming an extended microelectronic substrate, e.g., an extended semiconductor wafer 200 according to one embodiment of the invention. In such method, a releasable layer 205 is formed on a peripheral edge 214 of the semiconductor wafer 202 according to one or more of the techniques described above. The front surface 210 of the semiconductor wafer 202 is placed on an at least substantially planar inner face of a mold 250, such that the front surface 210 flatly contacts the inner face. A polymer is deposited into a cavity in the mold that is bounded by the inner face. The polymer preferably includes a material such as that described above, e.g., one or more materials selected from the group consisting of polyimide, polymethyl methacrylate, polycarbonate, and a combination of polyvinyl alcohol and melamine. The polymer is then solidified, e.g., set by heat, illumination, or contact with a hardening agent to form a removable annular edge extension element. The hardened polymer has a front surface which extends laterally from a peripheral edge of the semiconductor wafer to form a continuous surface including the front surface of the semiconductor wafer.

Figure 3:
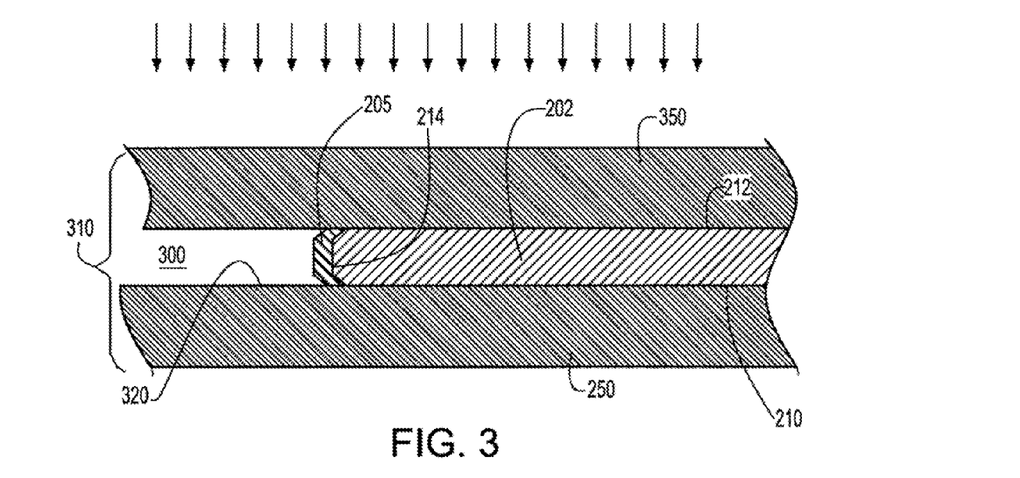
FIG. 3 is a sectional diagram illustrating a microelectronic substrate including an edge extension element and a method of forming an edge extension element onto an edge of the microelectronic substrate according to one embodiment of the invention.

FIG. 3 is a sectional view illustrating a particular embodiment in which the mold 310 includes a rear element 350 which contacts a rear surface 212 of the semiconductor wafer opposite from the front surface 210 at the time that the polymer is set to form an edge extension element. In this embodiment, the semiconductor wafer 202 and a polymer which included in the edge extension element are fully enclosed within the mold 310 when the polymer is set to form the edge extension element. The mold includes a substantially planar and flat inner face 320. The mold preferably includes a nonstick coating at the inner face such as, illustratively, fluoropolymers, e.g., polytetrafluoroethylene ("PTFE"), commonly known as "Teflon"® (trademark of Dupont), or other such coating. Alternatively, the mold may be made of another material which does not stick to the polymer being molded. The inner face 320 bounds a cavity 300 within the mold. After the releasable layer 205 is formed on the peripheral edge 214 of the wafer 202, the front surface 210 of the wafer is placed on the inner face 320 of the mold. A polymer is deposited or injected into the cavity in contact with the releasable layer 205 and the inner face 320 of the mold.

The rear element 350 of the mold is preferably transparent to a source of light used to set the polymer. Preferably, the rear element 350 is transparent to ultraviolet light and preferably the polymer is set by illuminating the polymer through the rear element 350 with ultraviolet light. Since the semiconductor wafer, especially a wafer consisting essentially of silicon, is substantially opaque to ultraviolet light, the wafer at least substantially blocks the ultraviolet light from reaching the front surface 210 of the wafer. In this way, if any of the deposited polymer material contacts the front surface 210 of the wafer when the ultraviolet light is setting the polymer, the ultraviolet light will not reach the front surface 210. Therefore, the ultraviolet light will not set the polymer at the front surface 210. The extended wafer, which includes the semiconductor wafer and the edge extension element attached thereto, has a geometry making it well-suited for use in both immersion lithography applications as well as in chemical mechanical polishing ("CMP") of the wafer. The extended wafer, including the semiconductor wafer together with the attached edge extension element are held in a chuck via mechanical pressure between the front and rear surfaces of the extended wafer. Because both the front surface of the extended wafer and the rear surface form continuous planes between the semiconductor wafer portion and the edge extension element, the extended wafer is subjected to uniform mechanical pressure, making it unlikely to bend or warp under such mechanical pressure.

In other embodiments (not illustrated) the ultraviolet exposure may be performed in a direction through the front element 250 of the mold towards the front surface 210 of the semiconductor wafer. In this embodiment, no deposited polymer material will remain on the rear surface of the wafer. This configuration may be preferred when an extended wafer is desired to provide uniform physical or electrical contact to the rear surface 212 of the wafer.

Figure 4:
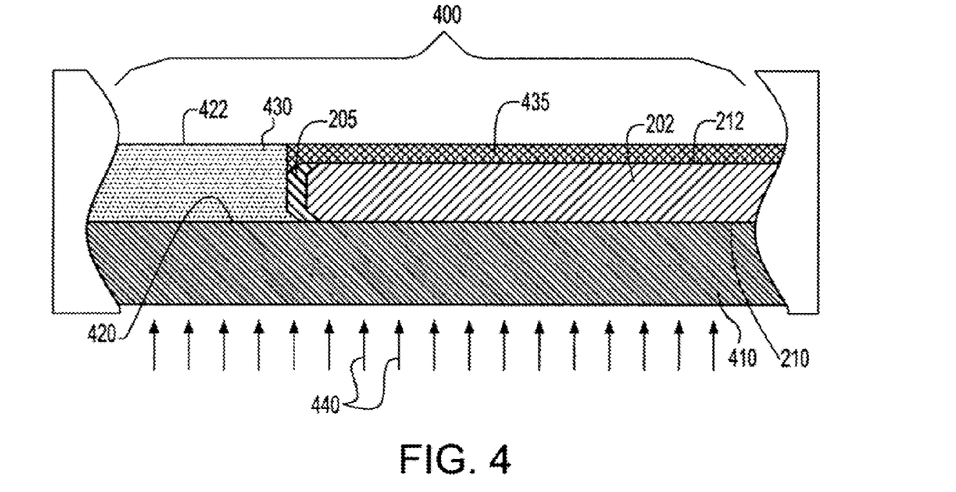
FIG. 4 is a sectional diagram illustrating a microelectronic substrate including an edge extension element and a method of forming an edge extension element onto an edge of the microelectronic substrate according to one embodiment of the invention.

FIG. 4 illustrates an alternative embodiment for use when the edge extension element need not have a rear surface co-planar with the rear surface of the wafer. In this method, the mold includes a front element 410 which is substantially transparent to a source of light, e.g., ultraviolet ("UV") light, which is used to set the polymer. As a preferred sequence of processing steps, the front surface 210 of the wafer, having the releasable layer 205 attached thereto, is placed on an inner face 420 of the front element 410. The polymer is then deposited onto the inner face 420 of the mold and in contact with the releasable layer 205. The exposing UV light 440 is then passed through the front element of the mold to set the polymer 430 in the region not blocked by the wafer 202. However, the polymer 435 remains in an unset state in the region overlying the rear surface 212 of the wafer 202 that is block from the exposing UV light. Therefore, the unset polymer 435 can be selectively removed from the rear surface of the wafer without removing the set polymer 430 which forms the edge extension element. The resulting rear surface 422 of the extended wafer 400 may not be co-planar to the rear surface 212 of the wafer 202 when the process is completed.

Figure 5:
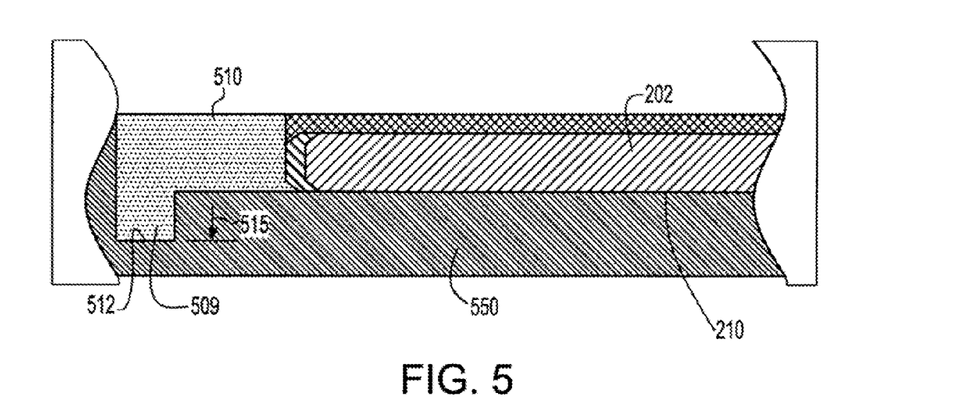
FIG. 5 is a sectional diagram illustrating a microelectronic substrate including an edge extension element and a method of forming an edge extension element onto an edge of the microelectronic substrate according to one embodiment of the invention.

FIG. 5 illustrates yet another embodiment in which the edge extension element 510 is molded to include a dam 509 which protrudes to a height 515 above a height above the front surface 210 of the wafer 202. The dam is preferably formed as an annular structure extending around the perimeter of the wafer. In this embodiment, the front element 550 of the mold contains an annular trench 512 extending around its perimeter such that the dam 509 is formed when the polymer is deposited into the mold and set.

Figure 6:
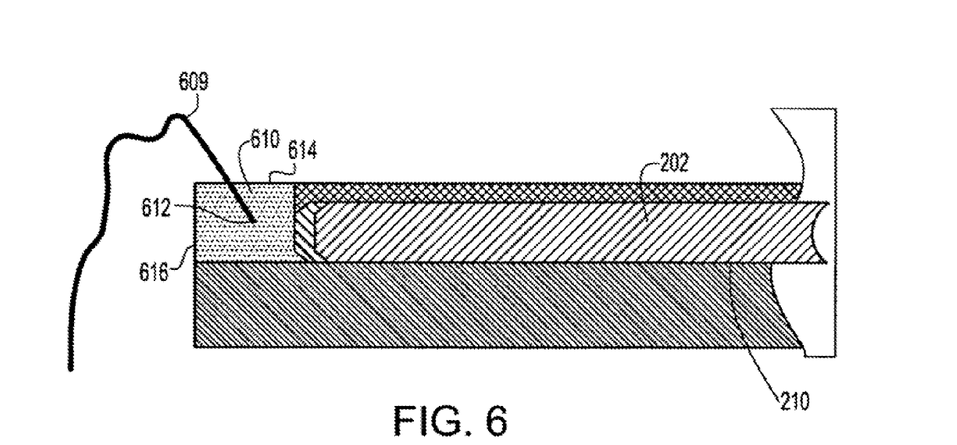
FIG. 6 is a sectional diagram illustrating a microelectronic substrate including an edge extension element and a method of forming an edge extension element onto an edge of the microelectronic substrate according to one embodiment of the invention.

FIG. 6 illustrates another embodiment in which a flexible sheet 609 is attached to or incorporated in the edge extension element 610. The flexible sheet extends around the entire periphery of the wafer as a device used to contain a liquid during processing. The flexible sheet 609 functions as an impermeable membrane to prevent the flow of the immersion liquid away from the front surface 210 of the wafer 202. Thus, the flexible sheet 609 prevents the immersion liquid from flowing off the wafer into places where it might interfere with the operation of processing equipment during immersion lithography processing. In one embodiment, one edge 612 of the flexible sheet is placed within the cavity of the mold prior to setting the polymer such that the flexible sheet is incorporated as an integral part of the edge extension element. In another embodiment, the edge 612 is attached to an exterior surface, e.g., rear surface 614 or side surface 616 of the edge extension element 610 after forming the edge extension element.

Figure 7:
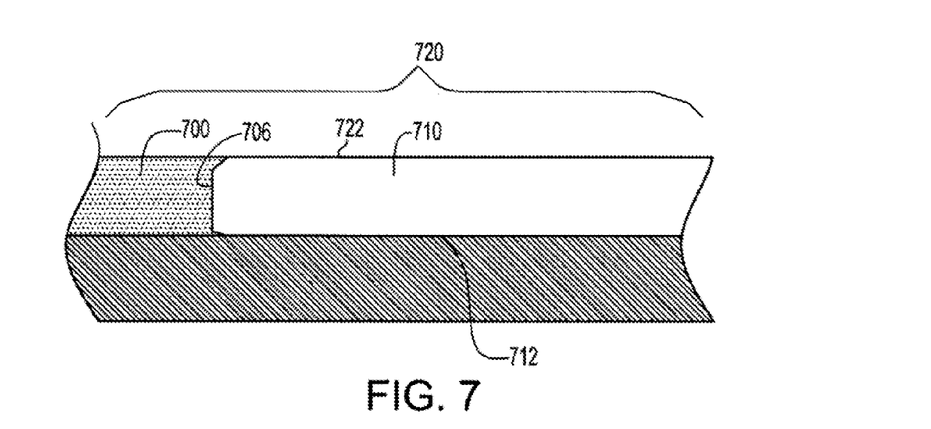
FIG. 7 is a sectional diagram illustrating a microelectronic substrate including an edge extension element and a method of forming an edge extension element on an edge of the microelectronic substrate according to a particular embodiment of the invention.

FIG. 7 illustrates an extended wafer 720 according to another embodiment in which the edge extension element 700 is formed to directly contact the peripheral edge 706 of the semiconductor wafer 710. In such way, the need for an intermediate releasable layer is eliminated. In this embodiment, the edge extension element is formed from a material which remains durable in water and other substances used during semiconductor processing but which is removable under certain conditions. Preferably, the edge extension element consists essentially of one or more materials which is at least substantially insoluble in water and at least substantially soluble in a solvent other than water, e.g., a solvent used to later remove the edge extension element from the semiconductor wafer. In a particular embodiment, the edge extension element is removable by a dry process such as oxygen ashing in which a reactive ion etch is applied to the rear surface 722 of the extended wafer 720. In such process, the wafer 710 shields the front surface 712 from being attacked when the edge extension element is selectively etched, leaving the wafer 710 intact.

In a particular embodiment, the edge extension element is formed from a polymeric material used as a "lift-off layer", such as the LOL-2000 product described above. Since such film is somewhat soluble in a developer solution used for photolithography, the connection between such extension element formed from LOL and the wafer could be slowly dissolved by the developer until the edge extension element is removed from the wafer.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. An article including a microelectronic substrate, comprising:
a microelectronic substrate having a front surface, a rear surface opposite said front surface and a peripheral edge at boundaries of said front and rear surfaces, said front surface being a major surface;
a removable annular edge extension element; and
a releasable layer;
said removable annular edge extension element having a front surface, a rear surface and an inner edge extending between said front and rear surfaces, said inner edge being joined to said peripheral edge of said microelectronic substrate by said releasable layer to form a continuous, co-planar, flat surface extending across said front surface of said edge extension element extending laterally from said releasable layer at the peripheral edge of the microelectronic substrate, said releasable layer and said front surface of said microelectronic substrate.

2. The article of claim 1, wherein said releasable layer is at least substantially insoluble in water and is at least substantially soluble in a solvent other than water.

3. The article of claim 1, wherein said microelectronic substrate includes a semiconductor wafer.

4. The article of claim 1, wherein said edge extension element consists essentially of at least one material selected from the group consisting of polyimide, polymethyl methacrylate, polycarbonate, and a combination of polyvinyl alcohol with melamine.

5. The article of claim 1, wherein said edge extension element includes a polymer.

6. The article of claim 5, wherein said polymer is a thermoset polymer.

7. The article of claim 5, wherein said polymer is settable by light.

8. The article of claim 5, wherein said edge extension element has a width ranging between about 0.25 cm and 2.5 cm.

9. The article of claim 5, wherein said edge extension element includes a flexible sheet extending upwardly to a height above said front surface of said edge extension element, said flexible sheet being adapted to prevent a liquid from flowing off of said continuous surface of said article.

10. The article of claim 1, wherein said edge extension element has a thickness between said front surface of said edge extension element and said rear surface of said edge extension element, said thickness of said edge extension element being greater than a thickness of said microelectronic substrate between said front surface and said rear surface of said microelectronic substrate as measured at a thickest part of said microelectronic substrate.

11. The article of claim 1, wherein said edge extension element has a thickness between said front surface of said edge extension element and said rear surface of said edge extension element, said thickness of said edge extension element being substantially the same as a thickness between said front surface of said microelectronic substrate and said rear surface of said microelectronic substrate.

12. The article of claim 1, wherein substantially all of said rear surface of said microelectronic substrate is exposed.

13. An article including a microelectronic substrate, comprising:
a microelectronic substrate having a front surface, a rear surface opposite said front surface and a peripheral edge at boundaries of said front and rear surfaces, said front surface being a major surface; and
a removable annular edge extension element having a front surface, a rear surface and an inner edge extending between said front and rear surfaces, said inner edge being joined to said peripheral edge of said microelectronic substrate to form a continuous surface including said front surface of said edge extension element extending laterally from the peripheral edge of the microelectronic substrate and said front surface of said microelectronic substrate, said continuous surface being substantially co-planar and flat where said peripheral edge is joined to said inner edge, said continuous surface extending beyond said peripheral edge, wherein said edge extension element directly contacts said peripheral edge of said microelectronic substrate, said edge extension element consisting essentially of one or more materials, said one or more materials being at least substantially insoluble in water and at least substantially soluble in a solvent other than water.

14. An article including a microelectronic substrate, comprising:
a microelectronic substrate having a front surface, a rear surface opposite said front surface and a peripheral edge at boundaries of said front and rear surfaces, said front surface being a major surface;
a removable annular edge extension element; and
a releasable layer;
said removable annular edge extension element having a front surface, a rear surface and an inner edge extending between said front and rear surfaces, said inner edge being joined to said peripheral edge of said microelectronic substrate by said releasable layer to form a continuous, co-planar, flat surface extending across said front surface of said edge extension element extending laterally from said releasable layer at the peripheral edge of the microelectronic substrate, said releasable layer and said front surface of said microelectronic substrate, wherein said edge extension element includes a polymer and, wherein said edge extension element has a body portion that contains said front surface that forms a part of the continuous, co-planar, flat surface and includes a dam extending from and beyond said continuous, co-planar, flat surface and away from said body portion, said dam including said polymer.

15. The article of claim 14, wherein said releasable layer is at least substantially insoluble in water and is at least substantially soluble in a solvent other than water.

16. The article of claim 14, wherein said microelectronic substrate includes a semiconductor wafer.

17. The article of claim 14, wherein substantially all of said rear surface of said microelectronic substrate is exposed.

18. The article of claim 14, wherein said polymer is a thermo-set polymer.

19. The article of claim 14, wherein said polymer is settable by light.

20. An article including a semiconductor wafer, comprising:
a semiconductor wafer having a front surface, a rear surface opposite said front surface and a peripheral edge at boundaries of said front and rear surfaces, said front surface being a major surface;
a removable annular edge extension element; and
a releasable layer;
said removable annular edge extension element consisting essentially of at least one material selected from the group consisting of a polymer settable by heat and a polymer settable by light, said edge extension element having a front surface, a rear surface and an inner edge extending between said front and rear surfaces, said inner edge being joined to said peripheral edge of said semiconductor wafer by said releasable layer to form a continuous, co-planar, flat surface extending across said front surface of said edge extension element extending laterally from said releasable layer at the peripheral edge of the microelectronic substrate, said releasable layer and said front surface of said semiconductor wafer, said front surface of said edge extension element extending laterally between about 0.25 cm and about 2.5 cm beyond said peripheral edge.

* * * * *